(12) United States Patent
Feiertag et al.

(10) Patent No.: US 8,553,920 B2
(45) Date of Patent: Oct. 8, 2013

(54) ARRANGEMENT COMPRISING A MICROPHONE

(75) Inventors: Gregor Feiertag, Munich (DE); Anton Leidl, Hohenbrunn (DE)

(73) Assignee: EPCOS AG, Munich (DE)

( * ) Notice: Subject to any disclaimer, the term of this patent is extended or adjusted under 35 U.S.C. 154(b) by 317 days.

(21) Appl. No.: 12/605,920

(22) Filed: Oct. 26, 2009

(65) Prior Publication Data

US 2010/0272302 A1 Oct. 28, 2010

(30) Foreign Application Priority Data

Oct. 27, 2008 (DE) .......................... 10 2008 053 327

(51) Int. Cl.
 *H04R 11/04* (2006.01)
(52) U.S. Cl.
 USPC ........... 381/355; 381/369; 381/360; 381/357; 381/373; 381/175
(58) Field of Classification Search
 USPC .................. 381/175, 355, 360, 369, 357, 373
 See application file for complete search history.

(56) References Cited

U.S. PATENT DOCUMENTS

| | | | |
|---|---|---|---|
| 7,903,831 B2 * | 3/2011 | Song | 381/174 |
| 2002/0102004 A1 * | 8/2002 | Minervini | 381/175 |
| 2004/0109579 A1 * | 6/2004 | Izuchi et al. | 381/369 |
| 2008/0247585 A1 * | 10/2008 | Leidl et al. | 381/360 |
| 2008/0279407 A1 | 11/2008 | Pahl | |
| 2008/0298621 A1 * | 12/2008 | Theuss et al. | 381/360 |
| 2008/0315334 A1 * | 12/2008 | Martin | 257/415 |
| 2009/0001553 A1 | 1/2009 | Pahl et al. | |

FOREIGN PATENT DOCUMENTS

| | | | | |
|---|---|---|---|---|
| CN | 1886008 A | | 12/2006 | |
| CN | 201138865 Y | | 10/2008 | |
| DE | 10 2005 008 512 A1 | | 8/2006 | |
| TW | 097200632 | * | 1/2008 | ............ H04R 25/00 |
| WO | WO 2005/086532 A2 | | 9/2005 | |
| WO | WO 2007/054070 A1 | | 5/2007 | |
| WO | WO 2007/054071 A1 | | 5/2007 | |

* cited by examiner

*Primary Examiner* — Davetta W Goins
*Assistant Examiner* — Amir Etesam
(74) *Attorney, Agent, or Firm* — Slater & Matsil, L.L.P.

(57) ABSTRACT

An arrangement includes a circuit carrier and a housed microphone. A mounting side of the housed microphone is mounted on a top side of the circuit carrier. The housed microphone includes solderable contacts on the mounting side and a sound entry opening facing the circuit carrier. An acoustic channel connects the sound entry opening and surroundings above the circuit carrier.

21 Claims, 3 Drawing Sheets

ARRANGEMENT COMPRISING A MICROPHONE

This application claims priority to German Patent Application 10 2008 053 327.0, which was filed Oct. 27, 2008. This application is incorporated herein by reference in its entirety.

BACKGROUND

Modern applications, in particular in communications technology, increasingly require miniaturized microphones. One way of effecting miniaturization, is to embody the microphone as an MEMS component (micro-electro-mechanical system) which is structured from and on, in particular, crystalline substrates such as silicon, for example, using micromechanical techniques. Such microphones can have, e.g., a capacitively acting or alternatively a piezo electric diaphragm in order to convert acoustic vibrations into electrical signals. Such miniaturized microphones are usually encapsulated in such a way that only a sound entry opening remains, which enables soundwaves to pass to the microphone diaphragm. In this case, the encapsulation can comprise a baseplate, on which a microphone chips is mounted. The baseplate can then have solderable contacts on the side of the microphone chip or on the opposite side to the microphone chip, by means of which the entire MEMS component (microphone) is mounted on the printed circuit board of an arbitrary circuit environment.

In principle, two different possibilities are appropriate here for mounting a microphone on a printed circuit board. Firstly, the microphone can be mounted on the top side of a printed circuit board with the sound entry opening facing upward. Microphones designed for this are known from PCT patent application WO2005/086532A2, for example.

A further possibility for mounting is to mount a microphone with a downwardly facing sound entry opening above a hole in the printed circuit board, with the result that the sound reaches the microphone through the hole in the printed board. Such an arrangement requires the microphone to be mounted on the underside of the printed circuit board, while the top side of the printed circuit board faces toward the outside, that is to say toward the sound entry. Microphones which are embodied as MEMS components and which are suitable for such mounting are known from PCT publication WO 2007/054070 or from WO 2007/054071, as examples.

To date, therefore, a microphone manufacturer has had to be able to offer at least two different microphone constructions, each of which can only be mounted using one of the two mounting techniques mentioned, if the manufacturer wants to provide components for both mounting techniques.

SUMMARY

In one aspect, the present invention makes the mounting of microphones more flexible, in order to enable different mounting techniques with the same component.

It is proposed to mount a microphone, having sound entry opening and solderable contacts on the same side, with downwardly facing sound entry opening on the top side of a circuit carrier. In order to ensure the passage of sound to the microphone, and in particular to the sound entry opening thereof, an acoustic channel is provided. The latter connects the sound entry opening to the surroundings above the circuit carrier, that is to say on that side of the circuit carrier on which the microphone is mounted. This novel arrangement makes it possible to mount one and the same microphone both on the top side and on the underside of a circuit carrier. Therefore, it is no longer necessary to use or stock different microphones for different mounting techniques. At the same time, the customer who incorporates the microphone in a circuit environment, with one and the same component, has a high design freedom regarding how and where the customer wishes to arrange the microphone on the circuit carrier.

A further advantage of microphones having sound entry opening and solderable (electrical) contacts on the same side is that microphones produced in the panel from a wafer or a comparable large-area workpiece, while joined in an assemblage can be applied and, e.g., adhesively bonded onto a sawing film. As a result, the microphones can be electrically and acoustically tested there from the same side in a simple manner.

The microphone is mounted with the sound entry opening facing downward on the circuit carrier, the acoustic channel beginning directly below the sound entry opening. For this purpose, the acoustic channel can be led at least partly within the circuit carrier.

It is possible to provide an upwardly open cutout in the circuit carrier and arrange the microphone with the sound entry opening above the cutout. In order to open the acoustic channel upward, the microphone can be mounted in such a way that it only partly covers the cutout with the result that the cutout laterally alongside the microphone remains open facing upward and thus creates an acoustic channel from the surroundings above the printed circuit board or the arrangement toward the sound entry opening.

It is also possible to lead the acoustic channel through the microphone and, in particular embody the microphone with a baseplate, on which a microphone chip (MEMs chip) is mounted and encapsulated. Given a sufficiently large base area of the baseplate, it is possible to provide a perforation laterally alongside the microphone chip in the baseplate, through which perforation the acoustic channel is led into the cutout. The sound entry opening of the microphone then leads downward from the microphone chip through the baseplate and faces downward into the cutout, that is to say, toward the circuit carrier. The acoustic channel then leads from there upward again in a manner diverted through 180° through the perforations in the baseplate alongside the microphone chip. In this embodiment, the microphone can completely cover the cutout in the circuit carrier. A defined acoustic channel is thus created, the dimensions of which are not determined by the mounting tolerance of the microphone on the circuit carrier.

It is also possible to form the acoustic channel at least partly in the baseplate of the microphone. The acoustic channel, e.g., running transversely therein, can then be led out laterally from the microphone. For this purpose, it is possible to structure the baseplate of the microphone on the underside and thus to form the acoustic channel between circuit carrier and baseplate.

However, it is also possible to form a downwardly open depression at the underside of the baseplate, through which depression the acoustic channel runs parallel to the underside. Perforations can then be provided in the baseplate laterally alongside the microphone chip, through which perforations the acoustic channel is led out upwardly from the microphone. This has the advantage that the acoustic channel in the microphone itself does not form a cavity which is closed on four or five sides and in which water could accumulate, e.g., in the course of the production process in particular during singulation by sawing, where water is used for cooling and/or rinsing.

The microphone can be sealed with respect to the circuit carrier by means of a seal having openings at least for the sound opening and/or the acoustic channel.

All embodiments wherein the acoustic channel is led in a manner angled through 180° in total have the advantage that the sound entry opening faces downward to the circuit carrier. As a result, the microphone diaphragm, which is arranged "behind" the sound entry opening as viewed in the sound direction, is protected against any direct rectilinear effect of harmful environmental influences. Thus, the direct effect of contaminants such as particles or drops is avoided or at least reduced. Moreover, the microphone chip is thus protected against electrical flashovers on account of ESD discharges. This particularly holds true if the microphone is further protected by a covering or a housing having an opening facing upward in extension of the acoustic channel.

A microphone mounted on top of the circuit carrier can be provided with a further covering. The latter can additionally cover the circuit carrier. It is also possible for the further covering to be part of the housing of the terminal into which the microphone or the arrangement comprising the microphone is incorporated. It is possible, for example, to place a substantially flat covering, e.g., a covering plate, on the printed circuit board, a required distance between covering plate and circuit carrier being ensured by spacers between printed circuit board and covering plate. A further opening is then provided in the covering plate, through which further opening the acoustic channel is led toward the outside, that is to say upward via the circuit carrier.

The covering can also be formed by a covering film which lies over microphone and printed circuit board in a positively locking manner and terminates against the printed circuit board. In this case, too, an opening is provided through which the acoustic channel is led.

It is also possible for the covering to be formed by a rigid cap that encloses beneath itself a cavity in which the microphone is arranged. In this cap, too, provision is made of openings for leading through the acoustic channel.

In the arrangement proposed, the sound experiences a redirection through 180° in the acoustic channel. What is astonishing here is that, by comparison with an arrangement without sound diversion, this leads to no appreciable additional attenuation of the acoustic signal if the acoustic channel has a sufficiently large cross section. A minimal cross section, although this already manifests losses, is approximately 100× 100 μm. Advantageously, however, the acoustic channel has a cross section of at least 200×200 μm. This cross section is then maintained as the minimum cross section over the entire length of the acoustic channel.

It is also possible for the acoustic channel to be embodied in the form of a plurality of partial channels which are guided in parallel fashion and which together have the desired minimum cross section. The proposed arrangement operates particularly advantageously and in a manner practically completely free of losses, without additional acoustic attenuation, if the acoustic channel has a minimum cross section of at least 0.1 mm$^2$ distributed over one or a plurality of openings or one or a plurality of partial channels. A plurality of openings can be provided, for example, if the microphone completely covers the cutout in the circuit carrier and the acoustic channel is led through a plurality of openings in the baseplate.

The microphone chip is advantageously a MEMs chip based on silicon. The chip is advantageously mounted on a baseplate for encapsulation purposes, the plate preferably being embodied in multilayered fashion. The baseplate can be a single- or multilayered ceramic plate or a plastic laminate, which is then likewise embodied in multilayered fashion.

An electrical wiring can be realized in the multilayered baseplate, particularly if the microphone additionally also has an IC component that is encapsulated together with the microphone chip in the microphone on the baseplate. The IC component can be connected up to the microphone chip and/or the baseplate of the microphone. However, it is also possible for microphone chip and IC component to form an interconnected unit which is connected to the baseplate by means of a reduced number of contacts.

For encapsulating the microphone chip, it is possible to provide rigid caps seated on the baseplate. However, it is also possible to form the covering on the baseplate by means of a covering film bearing closely against the microphone chip and/or against the IC component. A plastic covering, for example a glob top covering, can additionally be provided between microphone chip and/or IC component and covering film.

The baseplate has solderable contacts on the underside and can be mounted on the circuit carrier with the aid of solder bumps. This has the advantage that the spacing between microphone or baseplate and circuit carrier that is caused by the solder layer can contribute to the formation of the acoustic channel. In general, however, the spacing is not sufficient to provide the necessary minimum cross section for the acoustic channel. The latter is then formed, as proposed, by additional structuring in the circuit carrier and/or in the baseplate.

The technology according to which the microphone operates is unimportant for the functionality of the arrangement. The microphone can be operated capacitively, in which case the microphone diaphragm constitutes part of the capacitor with variable capacitor plate spacing and the respective capacitance is a measure of the deflection of the diaphragm. However, it is also possible to form a microphone chip with a piezoelectric diaphragm, in the case of which impinging sound is coupled into the piezoelectric material and the vibration generates an electrical signal at corresponding contacts.

BRIEF DESCRIPTION OF THE DRAWINGS

The invention is explained in more detail below on the basis of exemplary embodiments and the associated figures. The figures serve solely for illustrating the invention and have therefore been drawn up such that they are schematic and not true to scale. Neither absolute nor relative dimensional specifications can be inferred from the figures.

The following list of reference symbols can be used in conjunction with the drawings.

M Microphone
MC Microphone chip
ST Circuit carrier
SO Sound entry opening
AN Cutout
AK Acoustic channel
BP Baseplate DB Perforation in BP
BU Bump
AH Spacer
AD Covering
h Height of BU
OE Opening in AD

DETAILED DESCRIPTION OF ILLUSTRATIVE EMBODIMENTS

Figure 1A:
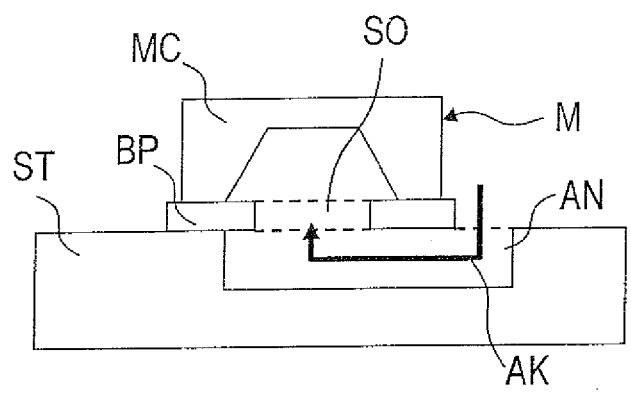
FIG. 1A shows a first example in schematic cross section.

FIG. 1A shows a first exemplary embodiment of the invention in schematic cross section. The microphone M is mounted on a circuit carrier ST. The circuit carrier ST has a cutout AN on its top side. The microphone M comprises a microphone chip MC, for example, which is mounted on a baseplate BP, in which a sound entry opening SO facing downward is provided.

An exemplary arrangement of the microphone chip MC wherein the microphone diaphragm is arranged in a manner facing upward has been chosen in the figure. However, it is also possible for the diaphragm of the microphone chip MC to face downward, so that the acoustic back volume is preformed by the corresponding depression in the microphone chip below (above) the diaphragm that arises during the production of the diaphragm.

Electrical connections between microphone chip MC, baseplate BP and circuit carrier ST are not illustrated in the figure. A possible encapsulation of the microphone M that seals the microphone chip MC above the baseplate BP is not illustrated either. Furthermore, the microphone can comprise an integrated circuit component that controls various functions of the microphone and comprises an amplifier, for example.

The downwardly facing sound entry opening SO is positioned above the cutout AN. In this case, the baseplate BP does not completely cover the cutout AN with the result that an acoustic channel AK is formed. The acoustic channel AK is led from the sound entry opening through the cutout AN and laterally with respect to the baseplate BP out from the cutout AN again. Consequently, despite a downwardly facing sound entry opening, it is ensured that the sound can pass unhindered from above the circuit carrier ST to and through the sound entry opening SO as far as the microphone chip MC. The arrow illustrated for the acoustic channel AK symbolizes the course of the sound, the propagation direction of which—coming from above the circuit carrier ST—after deflection twice experiences overall a redirection through 180°.

Figure 1B:
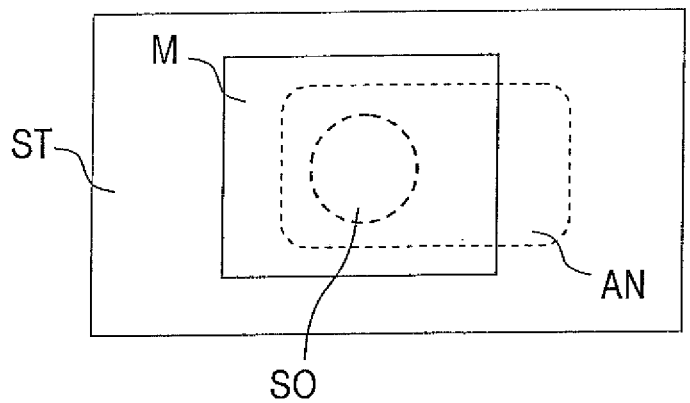
FIG. 1B shows this example in plan view.

FIG. 1B shows the arrangement in schematic plan view. The microphone M or its underside, which here corresponds to the dimensions of the baseplate BP, covers the cutout AN in the circuit carrier ST apart from a small opening, through which the acoustic channel AK is led. It is also apparent from the figure that the sound entry opening SO is arranged above the cutout AN. The base areas of baseplate BP, microphone M and cutout AN can, of course, deviate from the approximately rectangular form illustrated and in other examples have any other base and cross-sectional areas desired, depending on technology and function. They can be round, for example.

Figure 2A:
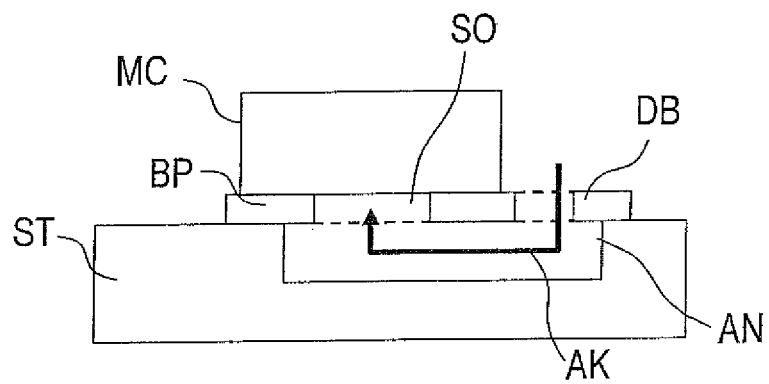
FIG. 2A shows a second exemplary embodiment in schematic cross section.

FIG. 2A shows a second embodiment, wherein, in contrast to the first embodiment (FIG. 1A) the baseplate BP of the microphone M completely covers the cutout AN in the circuit carrier ST. In this embodiment, therefore, the acoustic channel AK is led through a perforation DB formed in the baseplate laterally alongside the microphone chip MC through the baseplate.

Figure 2B:
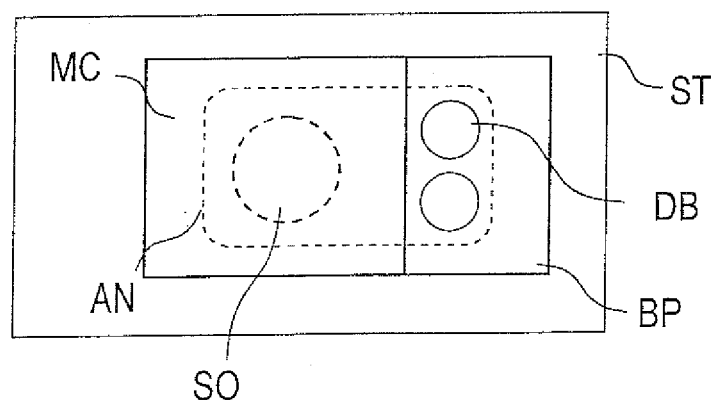
FIG. 2B shows this exemplary embodiment in plan view.

FIG. 2B shows the arrangement in schematic plan view. Two perforations DB are illustrated. These perforations DB are embodied in circular fashion here. However, it is also possible to provide only one perforation or a larger number of perforations in the baseplate BP, the form thereof not being critical for the invention. The precise shaping in particular of the cross-sectional area of the sound entry opening SO is equally uncritical for the invention.

Figure 3A:
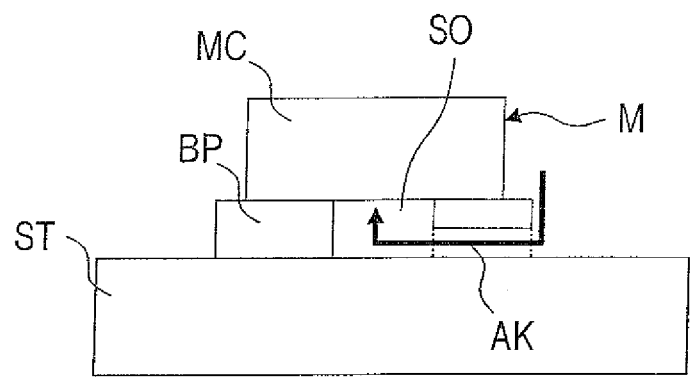
FIG. 3A show a third exemplary embodiment of the invention in schematic cross section.

FIG. 3A shows a third embodiment of the invention in schematic cross section. Here the circuit carrier ST has no cutout. In return, the acoustic channel AK is led through the baseplate BP. For this purpose, sufficient material is removed on the underside of the baseplate BP until an acoustic channel AK having the desired minimum cross section arises. In the figure, the acoustic channel AK is provided on the underside of the baseplate BP. However, it is also possible to lead the acoustic channel AK through the center of the baseplate BP or to lead the acoustic channel AK over the entire height of the baseplate BP or to provide for it a perforation having a height corresponding to that of the baseplate BP.

Figure 3B:
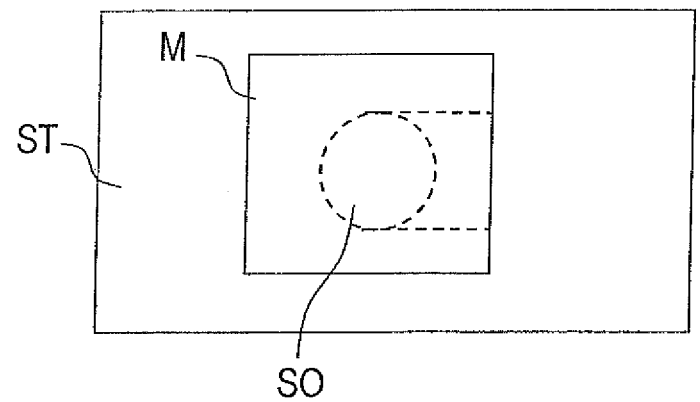
FIG. 3B shows this exemplary embodiment in plan view.

FIG. 3B shows the exemplary embodiment in schematic plan view. The acoustic channel AK or the perforation provided through the baseplate BP connects the sound entry opening SO to the region at the side of the microphone M. This region is illustrated as upwardly open here. The further diversion of the propagation direction or the further guidance of the acoustic signal can be supported by further measures (not specifically illustrated here), for example by arranging further elements on the circuit carrier, at the side walls of which further elements acoustic reflections toward the acoustic channel are possible.

Figure 4A:
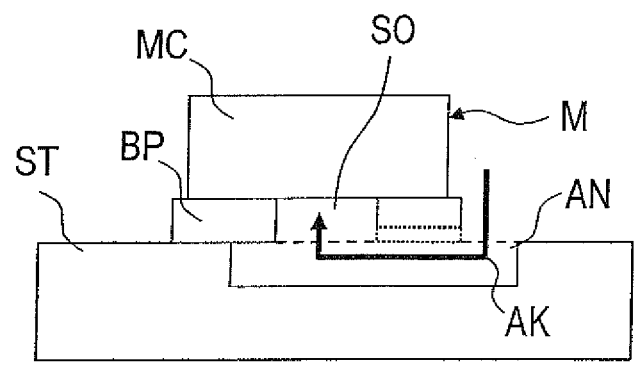
FIG. 4A shows a fourth exemplary embodiment in schematic cross section.

A fourth embodiment of the invention is illustrated in schematic cross section in FIG. 4a. This embodiment combines features of the first and third exemplary embodiments. The microphone M is arranged over a cutout AN in the circuit carrier ST in such a way that the cutout AN is not completely covered. In addition, material is removed from the underside of the baseplate BP along the acoustic channel AK in such a way that the cross section of the acoustic channel AK is increased. This has the advantage that, particularly in the case of thin circuit carriers, it is not necessary to remove too much material in the cutout or the cutout can be produced with a smaller depth.

Figure 4B:
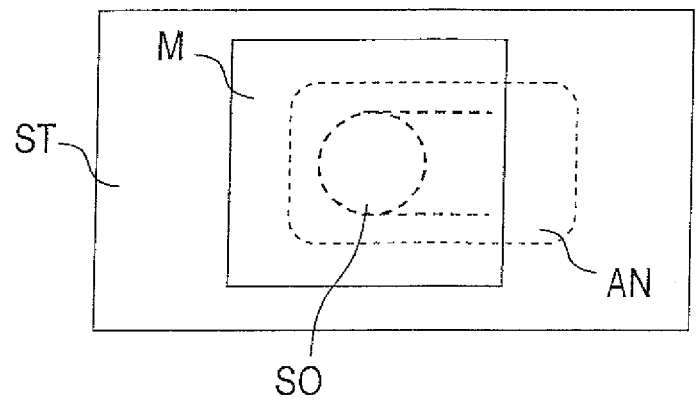
FIG. 4B shows this exemplary embodiment in plan view.

FIG. 4b shows the arrangement in schematic plan view. The base area of that part of the acoustic channel AK which is fashioned in the baseplate BP is shown smaller here than the base area of the cutout, but can be identical or larger.

The circuit carrier ST is preferably a multilayered printed circuit board having a dielectric layer as the topmost layer. For producing the cutout, it is advantageous to remove the topmost dielectric layer in the region of the cutout AN. In this case, a first metallization layer below the topmost dielectric layer can serve as a stop layer for the removal process.

It can be advantageous to increase the layer thickness of the topmost dielectric layer with respect to the remaining dielectric layers, in order to create a cutout having the necessary depth for obtaining a sufficient minimum cross section for the acoustic channel.

The topmost dielectric layer can be removed by means of a laser, by way of example. This has the advantage that it is not necessary to use an additional process during the production of the circuit carrier since laser ablation of the outermost dielectric layer is already used for producing microvias in known standard methods. However, it is also possible to produce the cutout mechanically, for example by milling. It is also possible to use an etching process here.

Figure 5:
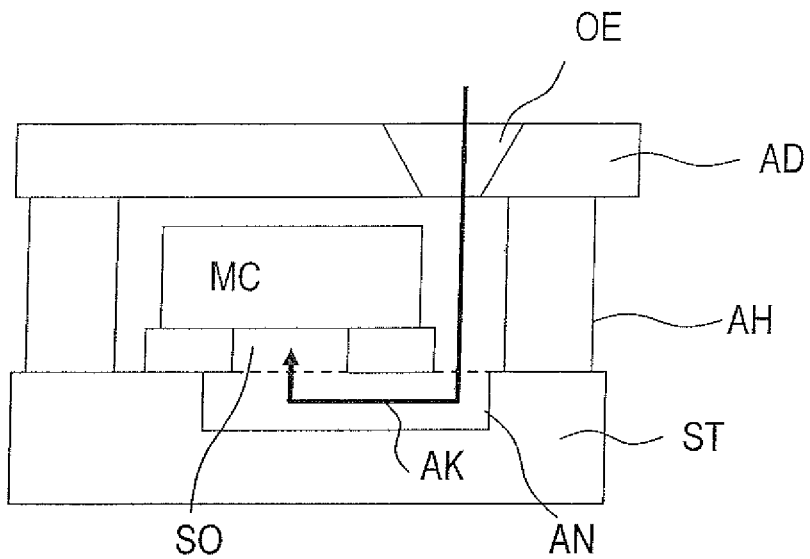
FIG. 5 shows in schematic cross section an arrangement according to the invention, this arrangement additionally also being provided with a covering.

FIG. 5 shows an arrangement refined further, wherein the microphone M above the circuit carrier ST is covered with the aid of a covering AD. The latter is on spacers AH, which fix the covering at a suitable distance from the circuit carrier ST and thus advantageously create a cavity for the microphone M. Furthermore, an opening OE is provided in the covering AD. The opening OE is provided in a centered fashion above the upwardly open part of the cutout AN, in order to avoid further bending of the acoustic channel AK. The covering AD can also be part of a housing into which the circuit carrier ST is incorporated, for example the housing of a mobile telephone.

Figure 6:
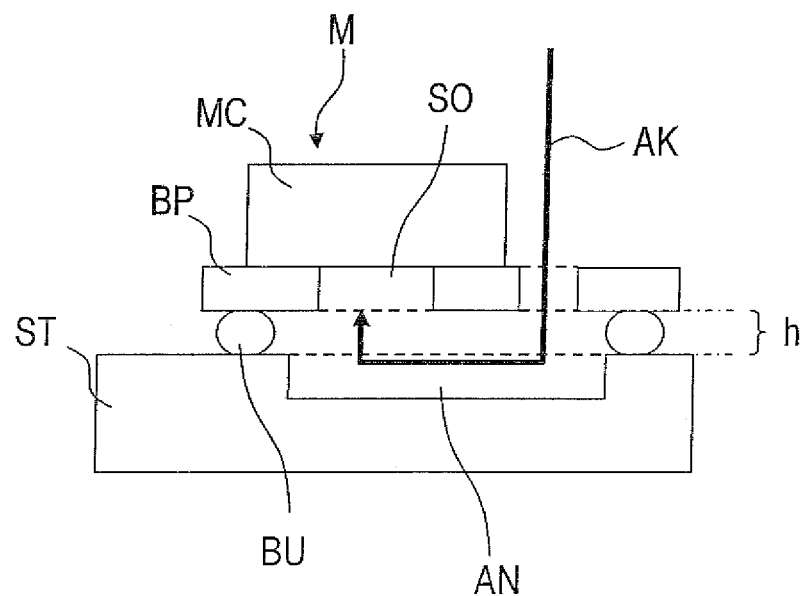
FIG. 6 shows a possible attachment of a microphone on a circuit carrier in schematic cross section.

FIG. 6 shows, in schematic cross section, a possible attachment of the microphone M on the circuit carrier ST. This attachment can be effected by means of bumps BU in a flip-chip arrangement, by way of example. Since the bumps BU fix the baseplate BP at a distance h from the circuit carrier ST corresponding to the diameter of the bumps BU after bonding, this clear distance h can contribute to the cross-sectional enlargement of the acoustic channel AK. It is therefore taken into account in the dimensioning of the cutout AN and has the effect that the cutout AN can be produced with a smaller depth than would be the case with a baseplate bearing directly on the circuit carrier.

Overall, the acoustic channel AK, the course of which is dependent on the positioning and dimensioning of a plurality of components, is configured such that a given minimum cross section of $0.1$ mm$^2$, for example is not undershot. What is achieved with a minimum cross section complied with is that an acoustic signal impinging from above the circuit carrier ST is not attenuated, or is attenuated only to an insignificant extent, upon passing through the acoustic channel AK.

The invention is not restricted to the exemplary embodiments described and illustrated in the figures. It is possible, in particular, to vary the form and configuration of the microphone, manner of attachment and precise guidance of the acoustic channel. Likewise, the arrangement can comprise further elements not illustrated in the figures, provided that consideration is given to not altering the essence of the invention, which provides sound guidance with 180° reversal via the acoustic channel AK. Furthermore, it is also possible to use microphones of different design or different technology.

What is claimed is:

1. An arrangement comprising:
    a circuit carrier that has an upwardly facing cutout at an upper surface of the circuit carrier;
    a housed microphone, a mounting side of the housed microphone mounted on the upper surface of the circuit carrier, the housed microphone including solderable contacts on the mounting side and a sound entry opening facing the circuit carrier, wherein the sound entry opening is arranged above the cutout; and
    an acoustic channel connecting the sound entry opening and surroundings above the circuit carrier, wherein the acoustic channel is led through the cutout such that the cutout laterally alongside the microphone remains open facing upward and thus creates the acoustic channel from the surroundings above the circuit carrier or the arrangement toward the sound entry opening.

2. The arrangement as claimed in claim 1, wherein the microphone only partly covers the cutout and wherein the acoustic channel is led out from the microphone through a non-covered region of the cutout.

3. The arrangement as claimed in claim 1, wherein the microphone comprises an encapsulated microphone chip mounted on a baseplate, wherein the sound entry opening is formed in the baseplate and the acoustic channel is at least partly formed in the baseplate.

4. The arrangement as claimed in claim 1,
    wherein the microphone comprises an encapsulated microphone chip mounted on a baseplate;
    wherein perforations are provided in the baseplate laterally alongside the microphone chip;
    wherein the microphone completely covers the cutout; and
    wherein the acoustic channel is led through the perforations.

5. The arrangement as claimed in claim 3, wherein the acoustic channel is formed in the baseplate and led out laterally from the microphone.

6. The arrangement as claimed in claim 3,
    wherein a downwardly open depression is disposed at an underside of the baseplate, the acoustic channel running through the depression; and
    wherein perforations are provided in the baseplate laterally alongside the microphone chip, the acoustic channel being led out upwardly from the microphone through the perforations.

7. The arrangement as claimed in claim 1, further comprising a covering, wherein the microphone is covered with the covering, the acoustic channel being led through the covering.

8. The arrangement as claimed in claim 7, wherein the covering is formed by a flat covering plate resting on spacers, the spacers being arranged between the circuit carrier and the covering plate.

9. The arrangement as claimed in claim 7, wherein the covering is formed by a covering film that is placed over the microphone and circuit carrier, the covering film terminating against the circuit carrier.

10. The arrangement as claimed in claim 7, wherein the covering is formed by a rigid cap that covers the microphone, the rigid cap being seated on the circuit carrier.

11. The arrangement as claimed in claim 1, wherein the microphone is attached to the circuit carrier by bonding or soldering in a flip-chip arrangement.

12. The arrangement as claimed in claim 1, wherein the microphone comprises an encapsulated microphone chip mounted on a baseplate.

13. The arrangement as claimed in claim 1, wherein the acoustic channel has a cross section of at least $200 \times 200$ μm.

14. The arrangement as claimed in claim 1, wherein the acoustic channel has a cross section of at least $0.1$ mm$^2$ distributed over one or more openings or partial channels.

15. The arrangement as claimed in claim 12, wherein the microphone chip is a MEMS chip based on silicon.

16. The arrangement as claimed in claim 12, wherein the microphone chip comprises a piezoelectric diaphragm.

17. The arrangement as claimed in claim 12, wherein the microphone chip measures changes in capacitance of a diaphragm.

18. The arrangement as claimed in claim 12, further comprising an integrated circuit component encapsulated alongside the microphone chip in the microphone.

19. The arrangement as claimed in claim 1, further comprising a seal, wherein the microphone is sealed with respect to the circuit carrier by the seal, the seal having at least one opening for the sound opening and/or the acoustic channel.

20. An arrangement comprising:
    a circuit carrier that has an upwardly facing cutout;
    a housed microphone, a mounting side of the housed microphone mounted on a top side of the circuit carrier, the housed microphone including solderable contacts on the mounting side and a sound entry opening facing the circuit carrier, wherein the sound entry opening is arranged above the cutout; and an acoustic channel includes a first upward facing opening connected to the sound entry opening and a second upward facing opening, the first and second upward facing openings connected by a lateral acoustic channel portion, the lateral acoustic channel portion being bounded at lower and side surfaces by the circuit carrier and being bounded at an upper surface by a portion of the housed microphone.

21. The arrangement as claimed in claim 20, further comprising a seal, wherein the microphone is sealed with respect to the circuit carrier by the seal, the seal having at least one opening for the sound opening and/or the acoustic channel.

* * * * *